United States Patent [19]
Kubodera et al.

[11] Patent Number: 5,332,442
[45] Date of Patent: Jul. 26, 1994

[54] SURFACE PROCESSING APPARATUS

[75] Inventors: Masao Kubodera; Masaki Narushima; Masahito Ozawa, all of Yamanashi; Hiromi Kumagai, Tokyo; Tomihiro Yonenaga; Sumi Tanaka, both of Yamanashi, all of Japan

[73] Assignee: Tokyo Electron Kabushiki Kaisha, Japan

[21] Appl. No.: 973,915

[22] Filed: Nov. 12, 1992

[30] Foreign Application Priority Data

Nov. 15, 1991 [JP] Japan ................................. 3-326676
Nov. 28, 1991 [JP] Japan ................................. 3-339912

[51] Int. Cl.$^5$ ............................................. C23C 16/00
[52] U.S. Cl. .................................... 118/725; 392/413; 392/415; 118/728
[58] Field of Search ................. 392/415, 413; 118/725, 118/728

[56] References Cited

U.S. PATENT DOCUMENTS

| | | | |
|---|---|---|---|
| 2,912,558 | 11/1959 | Root | 392/415 |
| 2,963,567 | 12/1960 | Roth | 392/413 |
| 3,062,987 | 11/1962 | Cuffman | 392/415 |
| 3,623,712 | 11/1971 | McNeilly | 118/725 |
| 4,615,294 | 10/1986 | Scapple | 118/725 |
| 4,817,558 | 4/1989 | Itoh | 118/725 |
| 4,836,138 | 6/1989 | Robinson | 118/725 |

FOREIGN PATENT DOCUMENTS 2-83918 3/1990 Japan .

Primary Examiner—Richard Bueker
Attorney, Agent, or Firm—Beveridge, DeGrandi, Weilacher & Young

[57] ABSTRACT

The present invention relates to a surface processing apparatus which performs heating processing of an object of heating which is mounted on a mounting device provided inside a process container, and which includes a plural number of lamps provided so as to oppose a rear surface of a processing surface of an object of processing, a rotating unit which has the plural number of lamps mounted to it in a ring shape, and a drive unit which drives the rotating unit. Also, the present invention relates to a processing apparatus for leading a process gas from a gas supply tube to a gas chamber partitioned inside a process container, and which blows process gas from an outlet of the gas chamber and onto an object of processing which is mounted on a mounting device provided inside the process container, and which includes a plural number of partition plates each provided with a plural number of through holes, being provided at required intervals in a direction of gas flow and inside the gas chamber.

14 Claims, 12 Drawing Sheets

SURFACE PROCESSING APPARATUS

BACKGROUND OF THE INVENTION

The present invention relates to a planar object (single wafer) processing apparatus process which semiconductor wafers or some other singular object for processing, and in particular, relates to a heating and surface processing apparatus using lamp heating.

When semiconductor devices such as IC and LSI are manufactured, a semiconductor substrate of silicon or the like is repeatedly processed to form a required semiconductor on the wafer.

In such semiconductor wafer processing, processing such as the CVD method or the like is used to form a thin film on the wafer. With such processing, it is necessary to heat the entire surface of the wafer uniformly and to a required temperature so as to suitably grow a thin film on the wafer.

With such a wafer heating method, the methods of heating can be broadly divided into those by heaters and those by lamps. Lamp heating is widely used because it supplies heat energy as radiant waves in a vacuum and so the speed of temperature increase is not dependent upon the medium for heat transmission.

FIG. 16 shows an example of a wafer being heated by a conventional lamp.

A wafer 1 of silicon or the like is arranged in a vacuum container 2 (such as a CVD processing chamber), and a reactive gas such as silane or the like is supplied to the chamber 2. A lamp 8 having a reflector mirror 16 is fixed to the outside of the vacuum container 2 and irradiates parallel rays through a glass window 5 in a configuration where the wafer 1 is heated from underneath.

With heating by rays from such a lamp 8, the temperature of places where there are many incident rays is higher than other places and so it is difficult to have uniform heating for the entire wafer.

In order to solve this problem, it has been proposed that a susceptor 20 of silica glass, silica carbonate, carbon or the like be placed between the wafer 1 and the lamp 8. More specifically, the susceptor 20 is irradiated with and heated by the rays from the lamp 8 and the applied energy is converted into uniform heat energy which is then radiated to the wafer 1 to uniformly heat its entire surface.

According to a heating method using the radiant heat from such a susceptor 20, it is possible to have uniform heating for the entire surface of the susceptor 20 but it is necessary to have lamps having a large output capacity in order to heat the susceptor 20 and so there is a drop in the energy efficiency. In addition, the coefficient of heat transmission for the radiant heat differs according pressure of the reactive gas inside the vacuum container 2 and so the heating speed of the wafer 1 differs according to the reactive gas, and there is the problem that control of the temperature becomes difficult. In addition, since minute amounts of impurities such alkali metals are included in the susceptor 20, irradiation and heating by the rays from the lamp 8 causes the impurities inside the susceptor 20 to separate and float inside the vacuum container 2 to contaminate the wafer 1 which is being processed.

Furthermore, in CVD and other such processes, when there is a large change in the process, the heat escape from the wafer 1 differs according to the process and so there are instances where the pattern of irradiation has to be changed. However, the conventional method cannot correspond to such changes. In addition, the wafer 1 is supported inside the vacuum container 2 at the periphery of the wafer 1 by a pushpin, and is fixed by a clamp ring from above the peripheral of the wafer 1. However, the heat which is supplied from beneath escapes via this clamp ring and although the heat may be uniformly supplied to the entire surface of the wafer 1, there is the disadvantage that the temperature of the peripheral edge portion of the wafer 1 drops. In addition, the speed of heating at the peripheral edge portion of the wafer 1 becomes different from the speed of heating at a portion close to the center and so there is the danger that there will be differences in the amount of rays.

Not only this, performing uniform thin film growth on a wafer and using a CVD process requires that the source gas have a uniform distribution across the entire surface of the surface of the object of processing.

As shown in FIG. 17, a conventional sheet type (single wafer) CVD apparatus has a semiconductor wafer 104 or some other object of processing arranged under the central portion of a processing chamber 102 inside a process container 100, and this semiconductor wafer 104 is heated from underneath by a heater 106 while the source gas is blown onto the front surface of the semiconductor wafer 104 from many holes 108 above.

These holes 108 are provided as a large number of many through holes 108a provided to a circular plate having a diameter larger than the diameter of the semiconductor wafer 104 and so are part of a gas outlet 110a of a lower portion of a gas chamber 110 partitioned off from the processing chamber 102. The gas introduction chamber 112 which connects with the upper portion of this gas chamber 110 supplies a source gas which is to become an element of the composition of the film grown to the semiconductor wafer 104, from a gas supply source (not shown) and via the gas supply pipes 114, 116.

In the case when a tungsten film is to be grown on a wafer for example, $WF_6$ gas which has been diluted to a required concentration by a carrier gas such as $N_2$ gas is supplied from one gas supply pipe 114 at a required flow rate, while $H_2$ gas to a required concentration is supplied at a required flow rate from the other gas supply pipe 116.

The $WF_6$ gas, $N_2$ gas and the $H_2$ gas supplied from the gas supply pipe 114, 116 to the gas introduction chamber 112 having a comparatively small flow area is led to the gas chamber 110 having a relatively large flow path area and the gases mix together in this chamber. Then, the mixed source gases ($WF_6$, $N_2$, $H_2$) are discharged from each of the holes 108a of the small hole plate 108 of the gas outlet 110a and are blown in the direction of the processing surface (upper surface) of the semiconductor wafer 104 immediately beneath them.

Moreover, even in the case of a conventional sheet type of plasma etching apparatus, a small hole plate and a gas chamber the same as those for the sheet-type CVD apparatus described above are used to blow an etching gas such as $CF_4$ or the like onto an object of processing.

However, as described above, with a conventional type of plasma etching apparatus or sheet-type CVD apparatus, the process gas is blown from the gas chamber 110 via the small hole plate 108 so that the process gas is distributed uniformly across the entire surface of the surface of the object of processing.

However, with the conventional apparatus, when the process gas enters the gas chamber 110 having a large flow path area from the gas introduction chamber 112 having a comparatively small flow path area, the flow of the process gas is diffused in the horizontal direction and is disturbed, and gas eddies occur when the process gas is discharged from each of the through holes 108a of the small hole plate 108. In addition, the process gas flows into the gas introduction chamber with considerable force from the gas supply pipe but with a conventional apparatus, the process gas which flows into the gas introduction chamber 112 is immediately blown from the small hole plate 108 in that state and so this is another cause of gas eddies. Yet another cause of gas eddies is that the plural number of process gases are not properly mixed.

In this manner, in a conventional apparatus, it is difficult for a plural number of process gases which have been completely mixed to be blown uniformly onto an entire surface of a surface of an object of processing, and therefore it is difficult for there to be uniform film formation on a wafer.

SUMMARY OF THE INVENTION

With respect to the problems described above as being associated with a semiconductor wafer processing apparatus of the conventional lamp heating type, the present invention has as an object the provision of a processing apparatus which has a heating means which can obtain a uniform temperature across an entire wafer surface, which enables uniform heating of an entire surface of a semiconductor by lamps and without the use of a susceptor, and which, even in the event of the escape of heat, provides compensation for such heat escape from a clamp ring.

Another object is the provision of a processing apparatus which can easily obtain an optimum heating pattern even if there is a change in the size of the wafer which is the object of processing.

The surface processing apparatus of the present invention is an apparatus which performs surface processing of an object of heating and which is mounted on a mounting means provided inside a vacuum container, and which is configured from a plural number of lamps provided so as to oppose an object of heating, a rotating unit which has the plural number of lamps mounted to it in a ring shape, and a drive source which drives the rotating unit.

In a first embodiment, the plural number of lamps are arranged in substantially the same shape as the peripheral edge of the object of heating.

In another embodiment, an axis of rotation of the rotating body and a center of a lamp array arranged on the rotating unit are off-center.

Furthermore, in another embodiment, lamps arranged on the rotating unit are provided with a lamp tilting mechanism.

In addition, in view of the problems associated with blowing a processing gas to a surface of an object of processing, the present invention has as a further object the provision of a surface processing apparatus which performs uniform film growth by block a processing gas at a uniform concentration and a uniform flow rate to an object of processing.

In order to attain the above objective, the surface processing apparatus of the present invention is a surface processing apparatus which leads a process gas from a gas supply tube, to a gas chamber partitioned inside a process container, and which blows process gas from an outlet of a gas chamber and to an object of processing, and is configured with a plural number of partition plates each provided with a plural number of through holes, being provided at required intervals in a direction of gas flow.

The process gas which flows from the gas supply pipe in such a configuration is stopped once by a first partition plate of the gas chamber and then passes the side of the second partition plate. When a plural number of process gases are provided, the first partition plate causes the process gases inside the partitioned first chamber to move and mix together. When gas chamber is of cylindrical shape for example, the second partition plate has through holes having a pattern symmetrical about the axis, of uniform density and in the direction of the radius, and makes the flow of the process gas from the side of the first partition plate uniform (laminar flow) in the direction of the radius. By this, the process gas is discharged at a uniform flow rate and concentration from the second partition plate. To the downstream side of the second partition plate is arranged a third partition plate provided with small through holes at a high density so that it is possible for the gas flow to the object of processing to be made even finer.

DETAILED DESCRIPTION OF THE PREFERRED EMBODIMENTS

First Embodiment

The following is a description of a first embodiment of a surface processing apparatus of the present invention, for the case when used for spattering processing or CVD processing of a semiconductor wafer.

Figure 1:
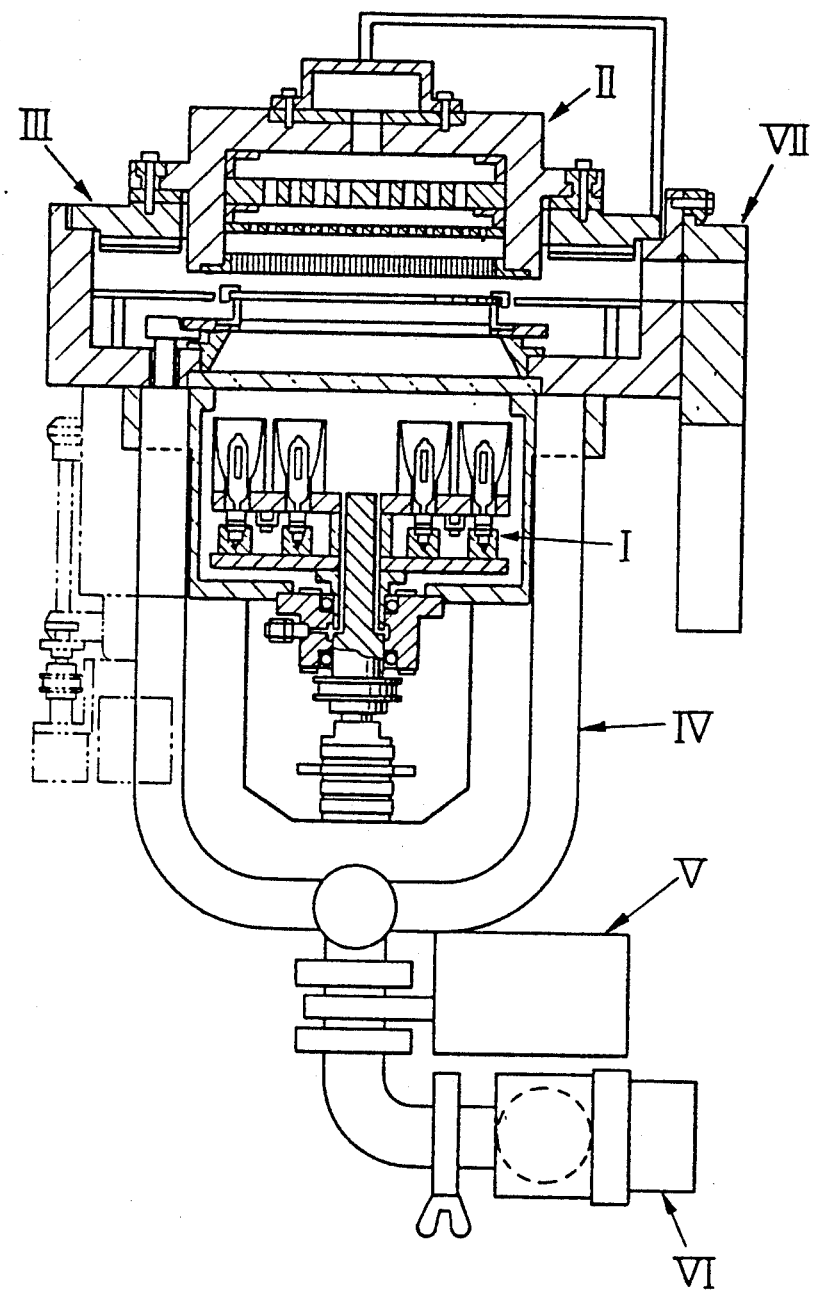
FIG. 1 is an outline view showing the entire configuration of the surface processing apparatus of the present invention.

As shown in FIG. 1, the surface processing apparatus of the present invention is configured from a heater apparatus I, a gas chamber II, a process container III, a gas exhaust tube IV connected to the process container III, and a throttle valve V and angle valve VI respectively connected to the gas exhaust tube IV. In addition, a gate valve VII is connected adjacent to the process container III. Then, a wafer which the object of processing is carried into the process container III from the load-lock chamber and the transfer chamber ( not shown) and via the gate valve VII.

Figure 2:
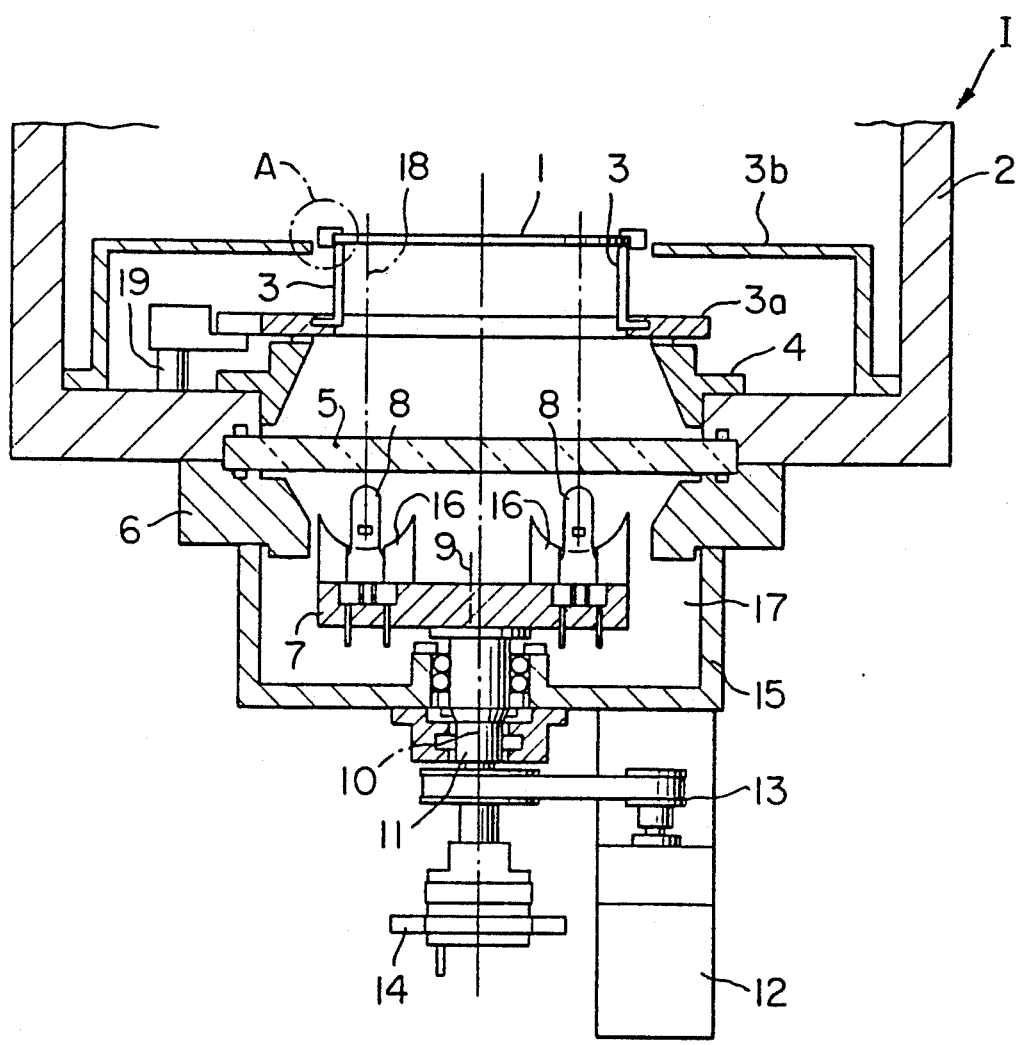
FIG. 2 is a longitudinal sectional view of a heating apparatus used in the surface processing apparatus of the present invention.
Figure 3:
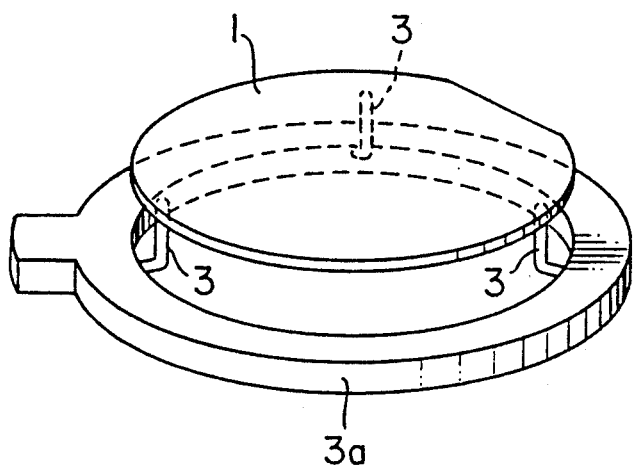
FIG. 3 is a partial perspective view showing the status where the wafer is supported by pusher pins in the heating apparatus shown in FIG. 2.
Figure 4:
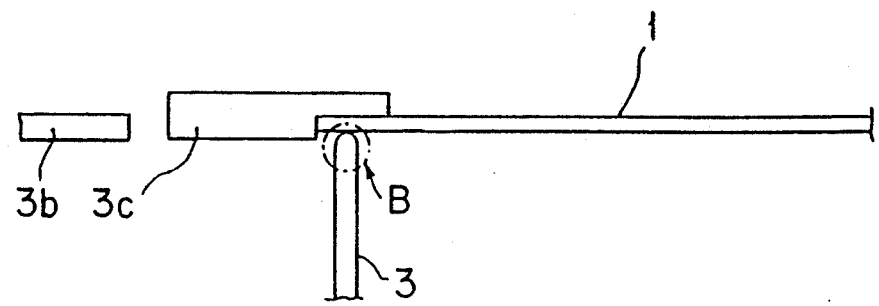
FIG. 4 is a view showing a partial enlargement of the clamp ring.

As shown in FIG. 2, a semiconductor wafer 1 which is the object of heating and which is to be heated to an optimum temperature is mounted with its surface to be processed, facing upwards, on pusher-pins (three, for example) which are the mounting means provided inside the vacuum container 2 which is the process container, and is fixed by a clamp ring 3c of SiC and as shown in FIG. 4. Then, a lifter fixes these pusher pins 3 to rings 3a above and below.

Figure 5:
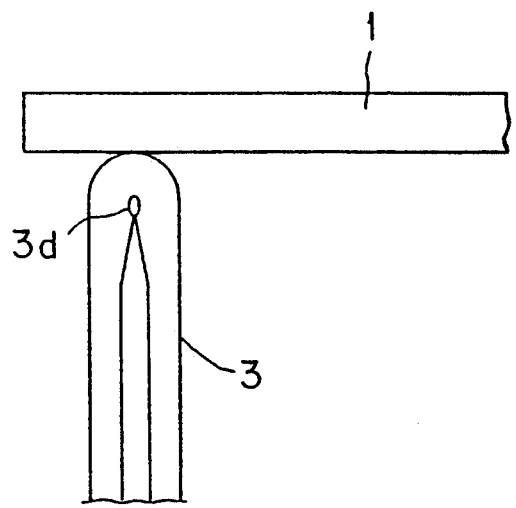
FIG. 5 is a view showing a partial enlargement of the portion B of the thermocouple shown in FIG. 4.

A light duct 4 formed with reflector mirrors on its inner surface is provided to concentrate the light irradiated to the central portion inside the vacuum container 2 and irradiate it to the wafer. The lower portion opening of the vacuum container 2 has a silica glass window 5 airtightly provided to lead the light from the light source provided on the outer side of the vacuum container 2, and to inside the vacuum container 2 which is maintained at a degree of vacuum suitable for the processing of the semiconductor wafer 1 (such as 50 Torr~10 mTorr in the case of CVD processing). In addition, a buffer 3b is provided to the periphery of the pusher pin 3. Furthermore, it is possible to have temperature control by a thermocouple 3d comprising alumina ceramic and as shown in FIG. 5, provided to the distal end of the pusher pins 3.

In addition, an inert gas is made to flow in the vicinity of the pusher pins 3 to prevent an unnecessary film from sticking to the rear side of the semiconductor wafer 1.

A light source chamber 17 comprising a housing 15 and a frame 6 is provided underneath the outside of the vacuum container 2, and this light source chamber 17 has a plural number of lamps 8 arranged on an upper surface of a turntable 7. The turntable 7 is attached to a shaft 11 which is driven by an induction motor 12 via a pulley 13 and which is mounted externally. The configuration is such that the centerline of rotation 10 of the shaft 11 is in agreement with the center line of the wafer 1, and the turntable rotates inside the light source chamber 17 at a speed of 30~60 times per minute.

The six lamps 8 for example, which are mounted on the turntable 7 are arranged off-center and equidistantly from the centerline of rotation 10 of the turntable 7, along a circle having the center 9. Accordingly, the track traced by one of the lamps 8 in one rotation is not a single line, and the configuration is such that the centerline of rotation 10 of the turntable 7 is the center and a plural number of circles having a constant width are formed in the vicinity of the peripheral edge of the semiconductor wafer 1.

In addition, power to the plural number of rotating lamps is supplied from a slip-ring 14 provided underneath the rotating shaft 11, and to the periphery of each of the lamps is provided a reflector mirror 16 comprising a rotating elliptical surface or parabolic surface which has the filament of the lamp 8 at its focus.

Figure 6:
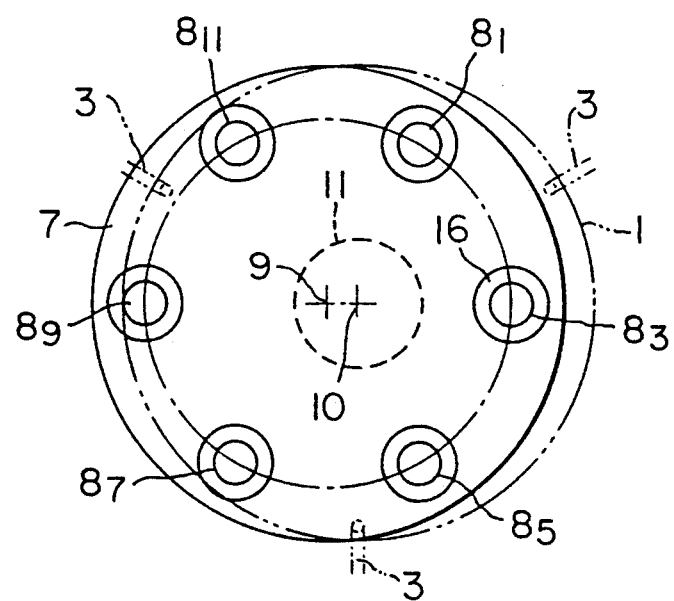
FIG. 6 is a plan view showing the arrangement relationship of the lamp and the wafer in the heating apparatus shown in FIG. 2.

The following is a description of the position relationship of the arrangement of the semiconductor wafer 1 and the lamp 8, with reference to FIG. 6.

Here, the semiconductor wafer 1 mounted on the (for example, four) pusher pins 3 is shown by the solid line. The center 9 of the turntable 7 mounted on the upper end of the shaft 11 is provided off-center from the center of the semiconductor wafer 1 which is the center 10 of the rotating shaft 11. Because of this, when the rotating shaft 11 rotates, the track of the light irradiated by the lamp 83 which is at the 3 o'clock position of FIG. 6 rotates to describe a circle of small radius and having the same center as the semiconductor wafer 1. Also, the track of the light irradiated by the lamp 89 at the 9 o'clock position of FIG. 6 rotates to describe a circle of large diameter and having the same center as the semiconductor wafer 1. In the same manner, the lamps 81 and 87 at the 1 o'clock and 7 o'clock positions and the lamps 85 and 811 at the 5 o'clock and 11 o'clock positions of FIG. 6, rotate to describe circles of sizes positioned between their respective concentric circles.

The configuration is such that the plural number of circles traced by this rotation of the lamps 8 are all positioned above the peripheral edge portion of the semiconductor wafer 1 and so the amount of light which is supplied to the semiconductor wafer 1 increases towards the peripheral edge portion of the semiconductor wafer 1. Accordingly, with the present invention, an amount of heat proportional to the amount of heat escaping from the pusher pins 3 in contact with the peripheral edge portion, and the heat irradiated from the peripheral edge portion of the water, is supplied in excess when compared to the center portion of the wafer and so the temperature of the peripheral edge portions and the center portion of the semiconductor wafer 1 is maintained uniform and it is possible for a constant reaction to proceed across the entire surface of the semiconductor wafer 1 and for a superior wafer having uniform characteristics to be obtained.

Figure 7:
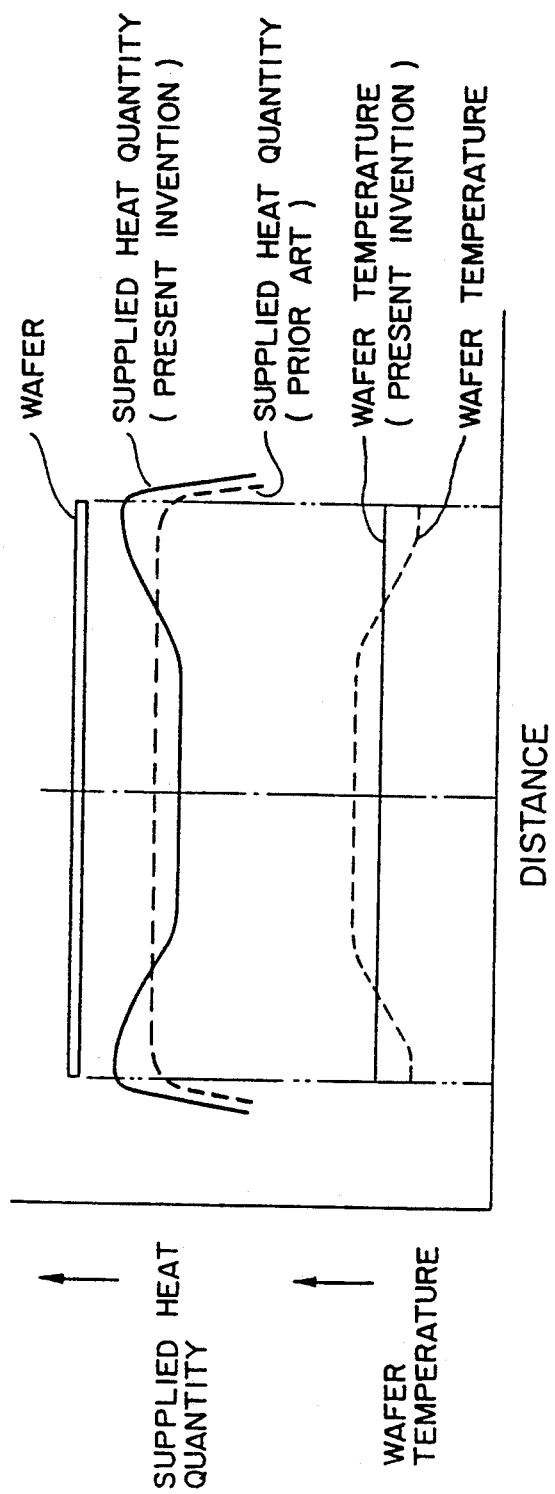
FIG. 7 is a comparison view of the heating characteristics of the heating apparatus of the surface processing apparatus of the present invention, and a conventional apparatus.

FIG. 7 shows a comparison of the present invention and the conventional technology for the relationship between the intensity of irradiation and the temperature.

When a conventional susceptor is used and the wafer is held and heated, the distribution of the heat which is irradiated to the wafer is uniform as shown by the thick, broken line in FIG. 7 but since there is heat escape from the clamp ring in contact with the wafer, and heat irradiated from the peripheral edge portion of the wafer, the temperature of the wafer drops at the peripheral edge portion of the wafer and as shown by the thin, broken line, and it is not possible to obtain a uniform temperature across the entire surface of the wafer.

However, with the surface processing apparatus of the present invention, it is possible for the center of heat irradiation from the heating lamps to be positioned over the peripheral edge of the wafer which is the object of heating and so the irradiation intensity of the light is maximum over the peripheral edge portion of the wafer, as shown by the thick solid line. Accordingly, it is possible to compensate for heat escape from the clamp ring in contact with the wafer, and heat irradiated from the peripheral edge portion of the wafer, and a uniform temperature is held across the entire surface of the wafer, without the generation of differences in the temperatures between the peripheral edge portion and the central portion of the wafer, as shown by thin, solid line.

Second Embodiment

Figure 8:
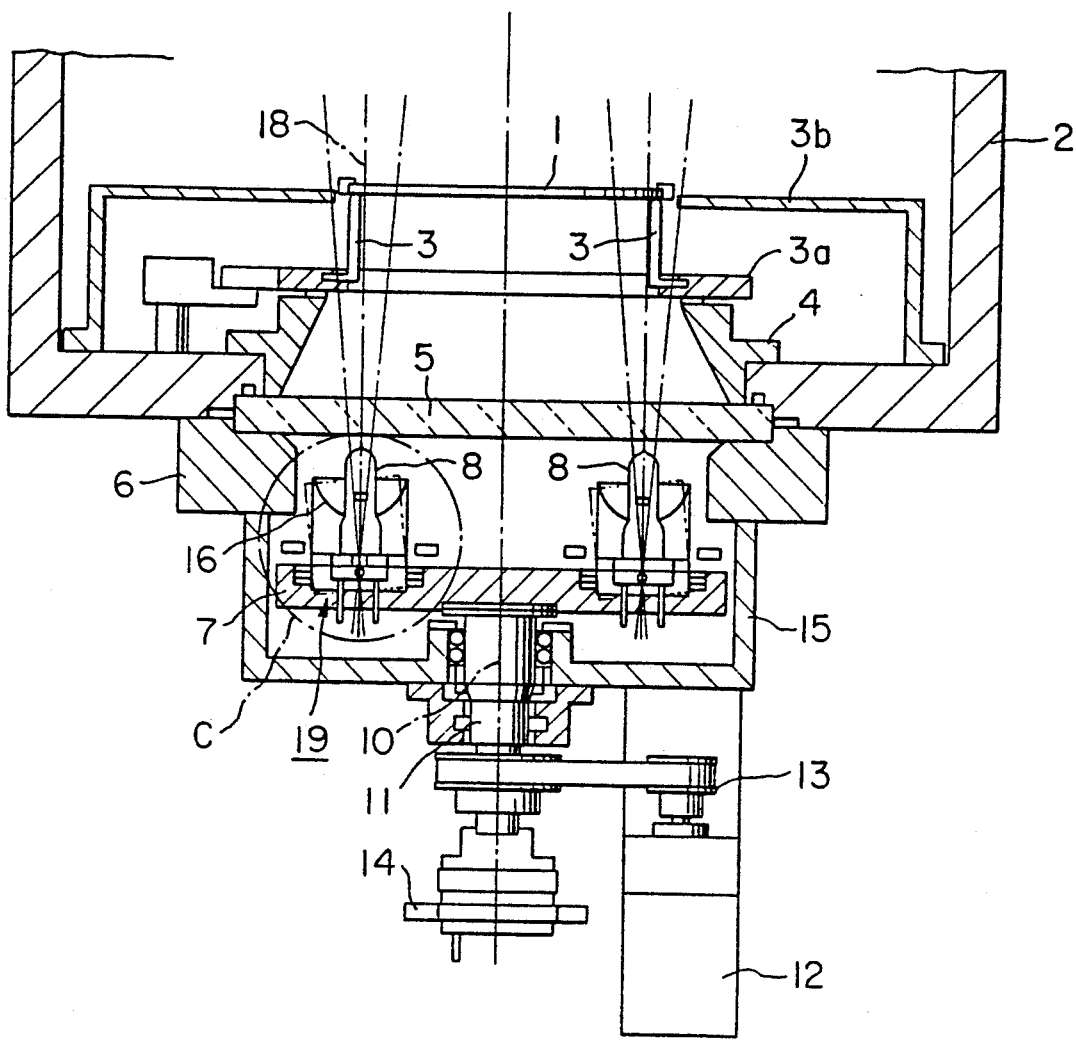
FIG. 8 is a longitudinal sectional view of another embodiment of the heating apparatus shown in FIG. 2.

The following is a description of a second embodiment of the present invention, with reference to FIG. 8.

The ways in which this second embodiment differs from the first embodiment shown in FIG. 2 are that the center of the arrangement of lamps 8 on the turntable 7 is provided on the same axis as the centerline of rotation 10 of the rotating shaft 1, and that a lamp tilting mechanism is provided so that each of the lamps 8 arranged on the turntable 7 can be tilted in the direction of the radius. The other portions of the configuration are the same as the first embodiment shown in FIG. 2. In FIG. 8, those portions of the second configuration which correspond to portions of the first embodiment shown in FIG. 2 are indicated with corresponding numerals, and the corresponding descriptions of them are omitted.

Figure 9:
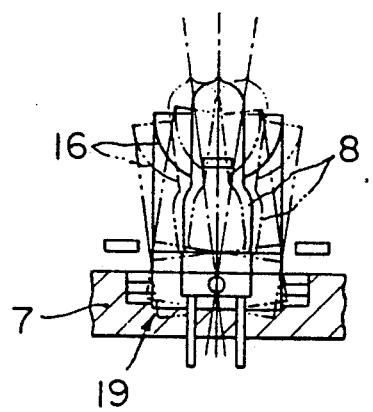
FIG. 9 is a partial enlarged view of the part A of FIG. 8.

More specifically, in this second embodiment, when there is rotation of the turntable upon which the lamp array is arranged so as to be on the same axis as the center axis of the wafer 1, the lamps 8 provided on the turntable are rotated in a circle concentric with the wafer 1. Here, as shown in FIG. 9, the configuration is such that the lamp tilting mechanisms 19 respectively provided to each of the lamps 8 is configured so that it can tilt back and forth in the direction of the radius of the lamp array 8, and so that the optical axes 18 can be freely tilted.

Accordingly, when the respective inclinations of the lamps 8 are different, it is possible to obtain a plural number of tracks of rotation for the lamps 8, in the same manner as for the first embodiment shown in FIG. 2, and for the amount of irradiation to be increased for a wide range as was possible for the embodiment of FIG. 2.

In addition, when the angles of inclination of each of the lamps 8 are changed by the same amount, it is possible to easily obtain a required circle of irradiation corresponding to the size of the semiconductor wafer 1. Accordingly, even if the processes are changed and the irradiation pattern changes, it is possible to easily and promptly obtain a heating pattern to correspond to-the changes.

Figure 10:
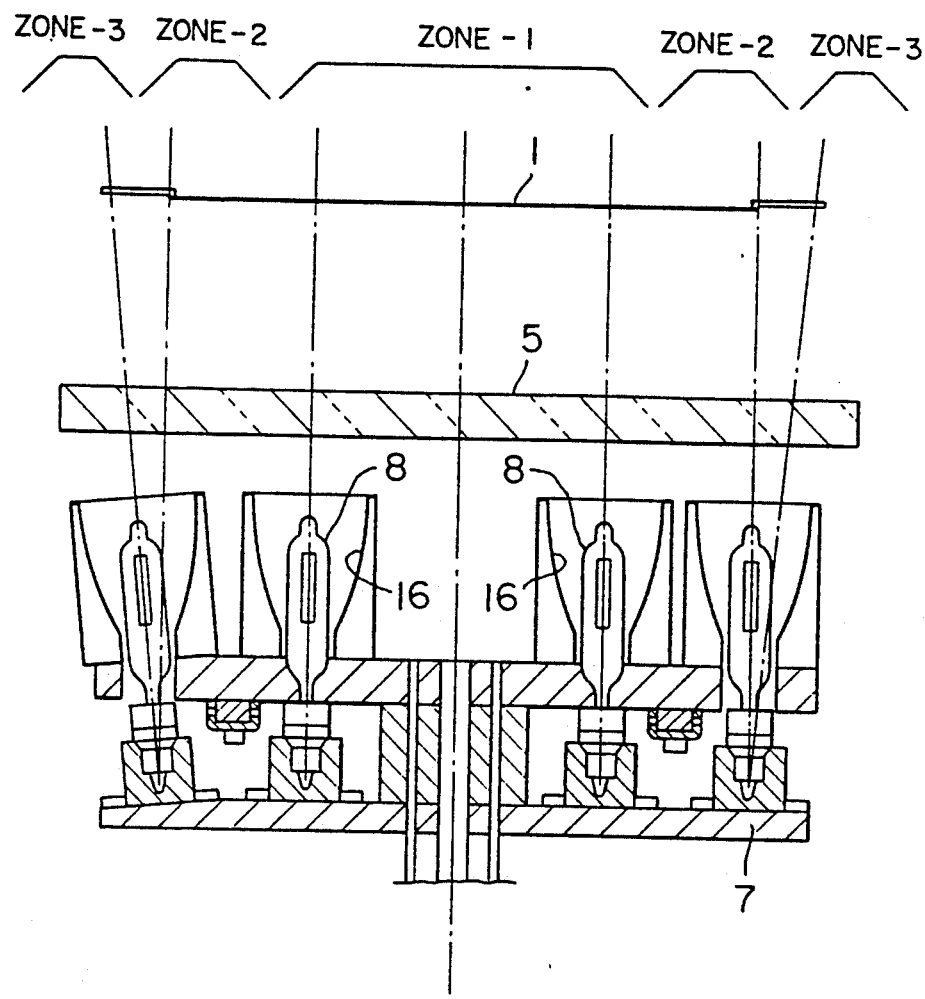
FIG. 10 is a longitudinal sectional view of yet another embodiment of the heating apparatus of FIG. 2.

In addition, as shown in FIG. 10, it is possible to uniform heating for the central portion as well as the peripheral edge portion of the semiconductor wafer 1 by arranging a plural number of lamps 8 on the inner side as well as a plural number of lamps 8 on the outer side and forming multiple heating zones (such as three zones, with zone 2 being a track at the center of lamp irradiation in the case of FIG. 10) and combining the tracks of rotation of the light through the use of reflector mirrors 16. In this case, it is possible to have individual control of the temperature of each zone by using a separately provided power controlled to control the power supplied to each zone. By this, it is possible to reduce the individual differences between each of the lamps 8 and eliminate scattering.

Figure 11:
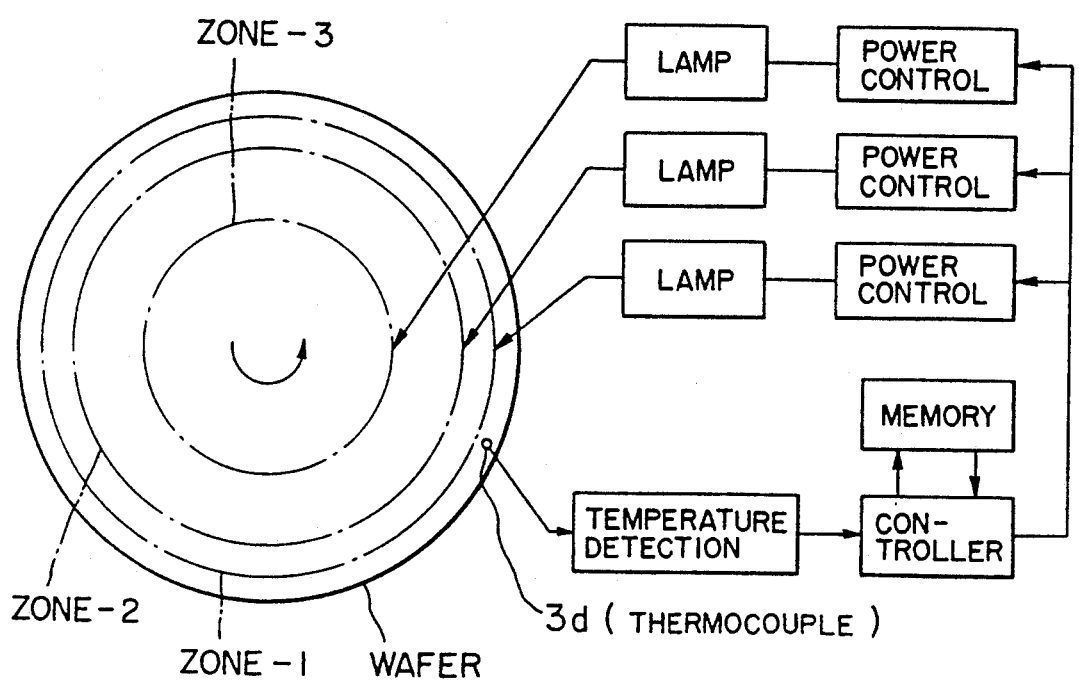
FIG. 11 is a view describing the method of temperature control for the plural number of zones.

In addition, as shown in FIG. 11, the following method is used to perform power control for the three zones, using one of the temperature detection data from the thermocouple 3d.

More specifically, the power supply ratio to each of the zones (zones 1~3) and which produces a uniform film growth for each wafer heating temperature is stored as data and selected by a controller in accordance with a required heating temperature, and the power supply ratio determined. Furthermore, the temperature of the wafer is measured by a plural number of thermocouples for each wafer heating temperature, and the lamp power supply ratio which produces a uniform temperature inside the wafer is stored as data and selected by a controller and in accordance with a required heating temperature and the power supply ratio determined.

In FIG. 11, there is only one place for temperature detection but a temperature detector is provided so as to correspond to the heating zone, and each zone is controlled to its respective temperature.

As has been disclosed above, it is possible to obtain the following and other effects according to the first embodiment and the second embodiment of the present invention.

(1) It is possible to use a direct heating method using lamps, to have fast heating of a wafer irrespective of the pressure of the reactive gas, and for the lamps to be rotated to have the amount of light irradiation to the wafer constant in the direction of the edge, for it not to be necessary to use a susceptor for lamp heating, and for contamination of the wafer due to impurities included in the susceptor to be prevented.

(2) It is possible to increase the amount of light irradiation to a peripheral edge portion of a wafer and to have wafer heating so that there is compensation for the escape of heat from the clamp ring, thereby preventing the lowering of the temperature of the peripheral edge portion of the wafer when compared to the center portion, easily obtaining a uniform temperature for across the entire surface of the wafer, and allowing favorable wafer processing.

(3) It is possible to have the center of the lamp arrangement off-center from the center of rotation of the turntable and so increase the amount of light irradiation to a wide range.

(4) Providing a lamp tilting mechanism enables the heating region to be easily changed by a simple configuration and so it is possible to quickly correspond to changes in the heating pattern even if there are changes in the pressure, the type of gas or other changes in the process.

Third Embodiment

The following is a description of a third embodiment of the present invention, with reference to FIG. 12~FIG. 15.

Figure 12:
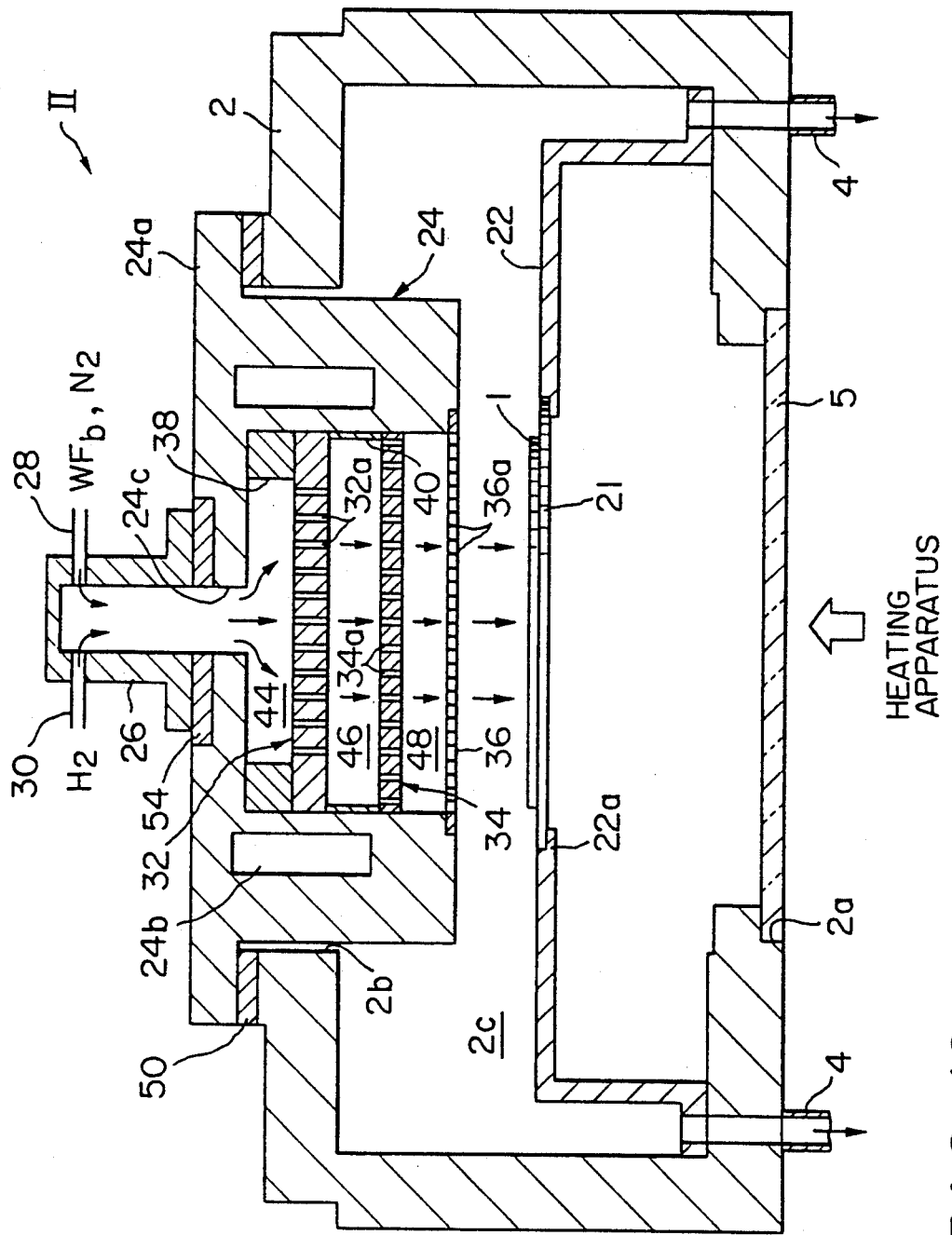
FIG. 12 is a longitudinal sectional view of the gas chamber portion of the surface processing apparatus of the present invention.
Figure 13:
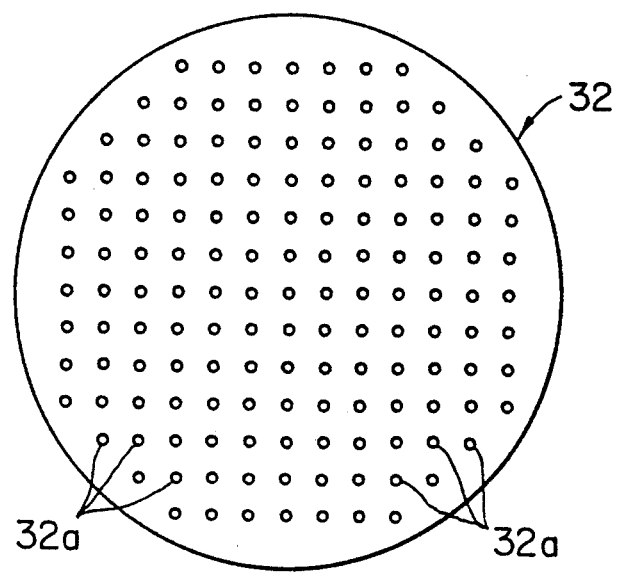
FIG. 13 is a plan view of a through hole pattern of a first partition plate of the gas chamber shown in FIG. 12.

In FIG. 12, the sheet-type CVD apparatus of the third embodiment, has a cylindrical process container 2 comprising aluminum for example, and in the center portion of this process container 2 is arranged a semiconductor wafer 1 for example, and which is the object of processing. This CVD apparatus uses a plate of silica glass, carbon or SiC 21 as a susceptor wafer mounting platform. This susceptor 21 is mounted to a circular shaped opening 22d of a cylindrical support plate 22 having a bottom which faces downwards, and the semiconductor wafer 1 is mounted on the susceptor 21. The rear surface of the susceptor 21 opposes a heating halogen lamp which is provided externally to the process container 10 via a silica glass plate 5 mounted to a circular opening in the central portion of the bottom surface of the process container 2. When there is film growth processing, the light from the heater apparatus (halogen lamp) passes through the silica glass plate 5 and is irradiated to the rear surface of a semiconductor wafer 1 and via the susceptor 21, and the semiconductor wafer 1 is heated.

In addition, a circular opening 2c is provided to the central portion of the upper surface 2c of the process container 2, and a cylindrical gas chamber 24 having a bottom facing downwards is mounted vertically so as to close the opening 2c. This gas chamber 24 is of a material such as aluminum or copper alloy and which has a high coefficient of thermal conductivity, and to the peripheral edge portion of the upper end is provided a ring-shaped mounting flange, inside which is provided a ring-shaped water path 24b in which flows cooling water. In addition, the gas chamber 24 is partitioned from the process chamber 2c inside the process container 2. To the center portion of the upper surface of the gas chamber 24 is provided a large-diameter gas hole for the introduction of gas, and a gas introduction chamber 26 is provided above this gas hole 24c, while the inside of the gas introduction chamber 26 has gas exit holes for the two gas supply pipes 28, 30.

When for example, this CVD apparatus is used to grow a tungsten film on a semiconductor wafer 1, $WF_6$ gas which has been diluted to a required concentration by $N_2$ gas is supplied at a required flow rate, from the gas supply pipe 28, while $H_2$ gas is supplied at a required amount from the other gas supply pipe 30.

To the inner side of the gas chamber 24 are respectively and horizontally mounted the three partition plates 32, 34, 36 at a required interval in the vertical direction. The first partition plate 32 which is at the uppermost stage, has a plate thickness of 20 mm for example, and has 153 holes for example, opened in the plate surface in a pattern such as that shown in FIG. 13 for example, is a circular plate of aluminum provided with through holes 32a having a diameter of 0.5 mm, and is arranged via a spacer 38 at a position 20 mm for example, below the upper surface on the inner side of the gas chamber 24. The second partition plate 34 of the middle stage, has a plate thickness of 10 mm for example, and has 252 holes for example, opened in the plate surface in a pattern such as that shown in FIG. 14. This second partition plate 34 is a circular plate of aluminum provided with through holes 34a having a diameter of 0.7 mm, and is arranged via a spacer 40 at a position 20 mm for example, below the lower surface of the first partition plate 32. The third partition plate 36 of the lowest stage has a plate thickness of 3 mm for example, and has 1740 holes for example, opened in the plate surface in a pattern such as that shown in FIG. 15. This third partition plate 36 is a circular plate of aluminum provided with through holes 36a having a diameter of 1.1 mm, and is arranged at a position 20 mm for example, below the lower surface of the second partition plate 34. These three stages of partition plates 32, 34, 36 and the spacers 38, 40 partition the three stages of gas flow control chambers 44, 46, 48 which each have a suitable flow path area inside the gas chamber 24.

Moreover, to the outer side of the gas chamber 24 are respectively provided insulating spacers 50, 54 between the gas chamber 24 and the upper surface of the process container 2, and between the upper surface of the gas chamber 24 and the gas introduction chamber 26.

The following is a description of the operation of a CVD apparatus having a configuration such as this. When there is film growth processing, the light energy from the halogen lamps beneath a semiconductor wafer 1 heat that semiconductor wafer which is mounted on a silica glass susceptor 21 while a mixed process gas ($WF_6$, $N_2$, $H_2$) is blown onto -the semiconductor wafer 1 from the gas chamber 24 above. The excess process gas and the gas generated by the film growth process is sent to a removal apparatus (not shown) via a gas exhaust tube and from a discharge opening provided in the bottom surface of the process container 2. More desirably, the configuration is such that discharge openings are provided at four or more places and the process gas exhausted uniformly from around the periphery of the semiconductor wafer 1.

In this CVD apparatus, the $WF_6$ gas, the $N_2$ gas and the $H_2$ gas introduced into the gas introduction chamber 26 from the gas supply pipes 28, 30 are led together from the gas introduction chamber 26 to the upper most stage of the gas control chamber 44 of the gas chamber 24, and is uniformly mixed there. This is to say that the first partition plate 32 provided to the bottom of this gas flow control chamber 44 has a large plate thickness with a small opening ratio and so there is a low conductance and a large pressure difference is generated between it and the gas flow control chamber 46. By this, the $WF_6$ gas, the $N_2$ gas and the $H_2$ gas is strongly urged from the gas introduction chamber 26 and stay there are they move, strike each other and are mixed inside the gas flow control chamber 44. In this manner, the uppermost stage of the gas flow control chamber 44 and the first partition plate 32 has the function of a buffer for the uniform mixing of the process gases. Moreover, the through holes 32a in the first partition plate 32 are distributed in the lattice pattern shown in FIG. 13, and so a mixed process gas ($WF_6$ gas, the $N_2$ gas and the $H_2$ gas) having a constant flow rate and concentration per unit surface area is discharged from each of the through holes 32a to the side of the middle stage gas flow control chamber 46.

Figure 14:
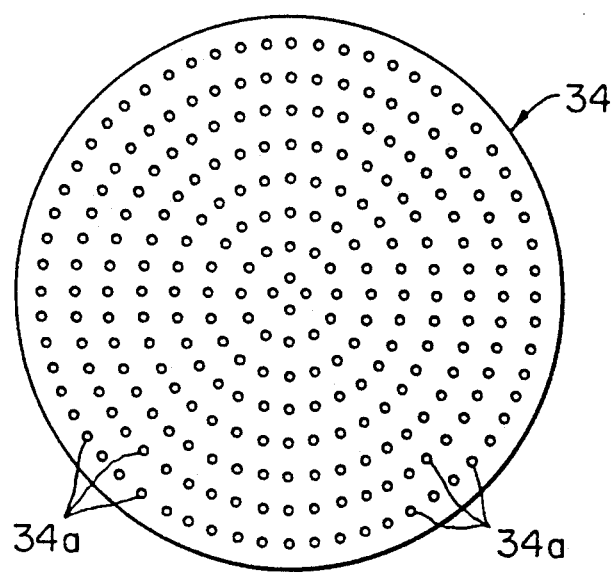
FIG. 14 is a plan view of a through hole pattern of the second partition plate of the gas chamber shown in FIG. 12.
Figure 15:
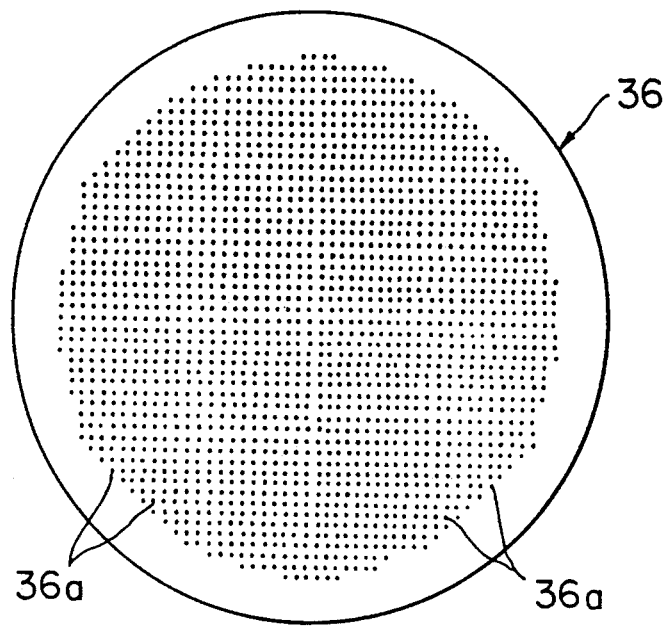
FIG. 15 is a plan view showing a through hole pattern of the third partition plate of the gas chamber shown in FIG. 12.
Figure 16:
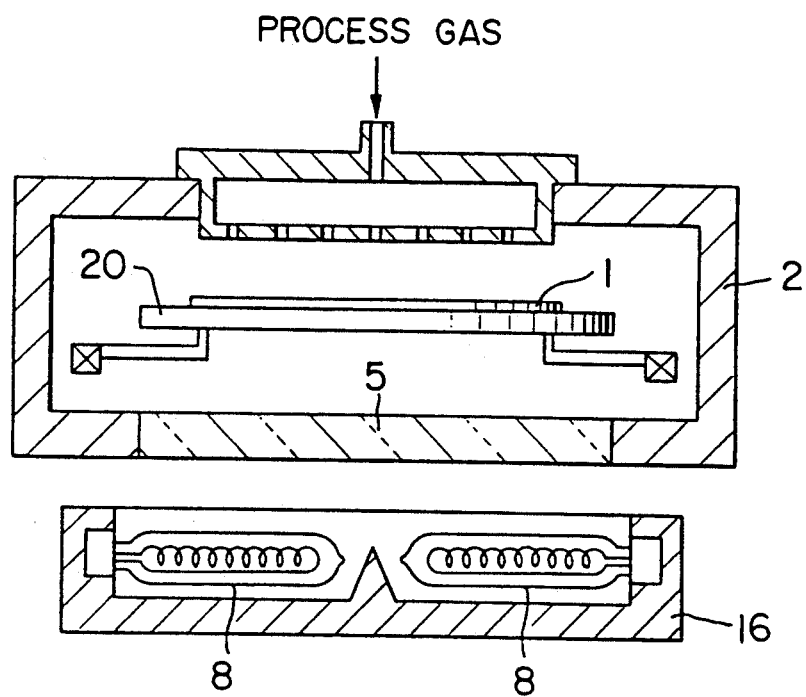
FIG. 16 is an outline view of the configuration of a conventional lamp heating apparatus.
Figure 17:
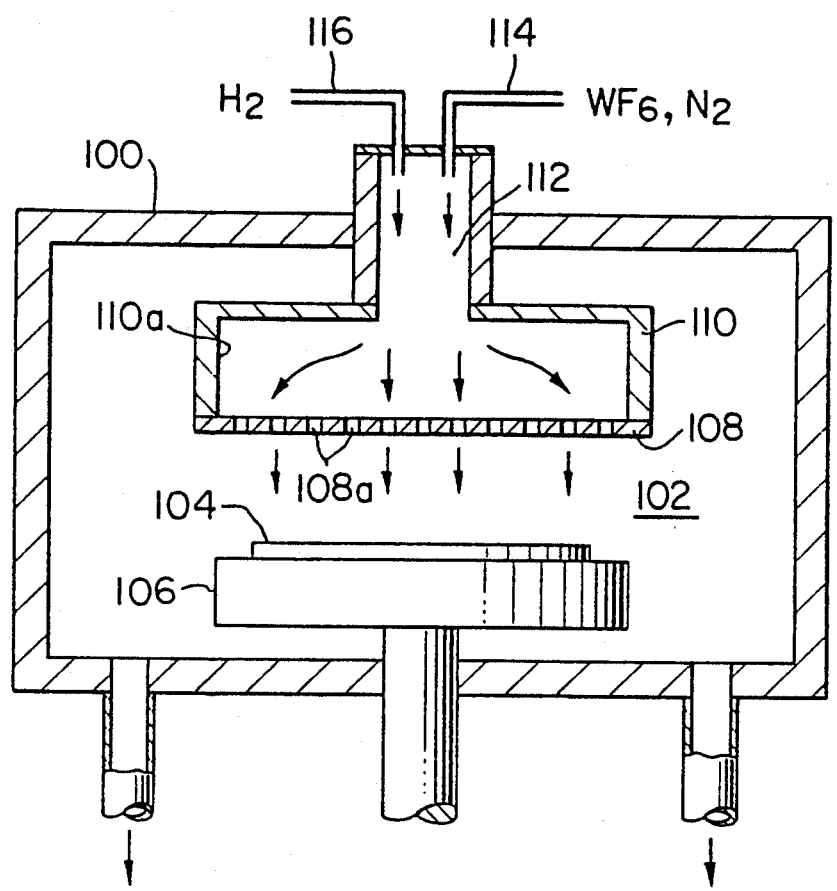
FIG. 17 is an outline view of a conventional gas chamber.

The mixed process gas ($WF_6$ gas, $N_2$ gas and $H_2$ gas) which has entered the middle stage gas flow control chamber 46 has the gas flow adjusted by the second partition plate 34 on the bottom of this chamber 46 so that the flow rate and concentration per unit surface area are uniform in the direction of the radius. This is to say that the through holes 34a of the second partition plate 34 are distributed at a uniform density in the direction of the radius, and are symmetrical about the axis and so the concentration and the flow of the mixed process gas ($WF_6$ gas, $N_2$ gas and $H_2$ gas) in the direction of the radius inside the cylindrical shaped gas chamber 24 is constant and symmetrical about the axis as shown in FIG. 14. In this manner, the middle stage gas flow control chamber 46 and the second partition plate 34 have the function of gas flow adjustment. Moreover, the plate thickness of this second partition plate 34 is relatively large and so there is also a certain amount of buffer effect in the gas flow control chamber 46 as well, with further mixing of the mixed process gas ($WF_6$ gas, $N_2$ gas and $H_2$ gas).

The mixed process gas (WF$_6$ gas, N$_2$ gas and H$_2$ gas) which has left the middle stage gas flow control chamber 46 passes at a relatively high speed through the lower stage gas flow control chamber 48 and is discharged from each of the through holes of the third partition plate 36 at a more uniform flow rate and a more uniform concentration, and flows uniformly over the entire surface (upper surface) of the semiconductor wafer 1 immediately beneath. The third partition plate 36 is a thin plate which has a large opening ratio and so there is a large conductance, while the through holes 36a are small holes at a high density and so the gas flow of the mixed gas (WF$_6$ gas, N$_2$ gas and H$_2$ gas) becomes finer. In this manner, the lower stage gas flow control chamber 48 and the third partition plate 36 function to make the gas flow finer.

By making the diameter of the through holes 36a of the second partition plate 34 small while increasing the density, it is possible to omit the third partition plate 36 and the lower stage gas flow control chamber 48. In addition, the first partition plate 32 can be configured from a ceramic plate or a metal particle sheet or the like and which has many holes, while the pattern of the through holes of the first partition plate 32 can be a symmetrical pattern which is the same as the second partition plate 34. In addition, in accordance with necessity, it is possible to select an arbitrary pattern for the through hole patterns of each of the partition plates, while arbitrary intervals and thicknesses can be selected for the plate thicknesses of each of the partition plates. In addition, it is also possible to arbitrarily select the number and the diameters of the through holes. The gas flow control chamber can be filled with spherical beads or glass wool or the like.

Two process gases where introduced in the third embodiment described above, but there can be the introduction of only one process gas. Also, the present apparatus is not limited in application to CVD apparatus, as it can be applied to plasma etching apparatus and other types of surface processing apparatus.

As has been described above, according to a process apparatus of a third embodiment of the present invention, arranging a plural number of partition plates each provided with many holes, inside a gas chamber which receives a process gas from a gas supply pipe, at a required interval in a direction of gas flow enables a process gas to be blown onto an object of processing at a uniform flow and a uniform concentration, and thereby enables uniform film growth on the object of processing.

What is claimed is:

1. A surface processing apparatus which performs heat processing of a single object for processing inside a process chamber, said surface processing apparatus comprising:
   a stationary mounting means, located inside the process chamber, for horizontally mounting an object for processing:
   a plurality of heat lamps located so as to oppose a rear surface, opposite a processing surface, of an object for processing;
   a unit which has a rotatable turntable, said plurality of lamps being mounted to said turntable in a ring shape;
   a drive unit which rotatably drives said turntable; and
   a transparent window means for airtightly isolating the process chamber from an area containing said rotatable turntable and said lamps, said window means being transparent to radiation from said lamps for heating a rear surface of and object for processing mounted on said mounting means.
2. The processing apparatus of claim 1, wherein:
   said ring shape substantially conforms to the shape of the peripheral edge of said object for processing.
3. The processing apparatus of claim 1, wherein:
   said apparatus includes a shaft connected to said turntable and having an axis of rotation, said axis of rotation being off-set.
4. The processing apparatus of claim 1, wherein:
   said turntable includes a lamp tilting means for mounting at least one of said lamps such that the axial axis through said at least one lamp is tilted with respect to the plane of the rear surface of an object for processing.
5. The processing apparatus of claim 1, wherein:
   said apparatus includes another plurality of lamps arranged in a plurality of concentric rings.
6. The processing apparatus of claim 1 which further includes a means for leading a process gas from a gas supply tube to a partitioned gas chamber located inside said process chamber, and for blowing process gas from an outlet of said gas chamber onto said object for processing, said partitioned gas chamber comprising
   a plural number of partition plates each provided with a plural number of through holes, said plates being provided at required intervals along a direction of gas flow and inside said partitioned gas chamber.
7. The processing apparatus of claim 6, wherein:
   each successive partition plate has an increasing number of through holes in a downstream direction of a process gas flow.
8. The processing apparatus of claim 6, wherein:
   a flow path area of each partition plate increases due to increases in the diameter of the through holes provided in each successive partition plate.
9. The processing apparatus of claim 6, wherein:
   through holes provided to said partition plate are distributed in a lattice shape.
10. The processing apparatus of claim 6, wherein:
    through holes provided to said partition plate are distributed uniformly in a direction radial to and symmetric about a central axis.
11. The processing apparatus of claim 6, wherein:
    said object for processing is a semiconductor wafer.
12. The processing apparatus of claim 1, wherein:
    said stationary mounting means includes a plurality of pins contacting a rear surface of an object for processing, at a circumferential portion thereof.
13. The processing apparatus of claim 12, wherein:
    at least one pin of said plurality of pins includes a thermocouple.
14. The processing apparatus of claim 4, further comprising a logic means connected to a power control which energizes said lamps.

* * * * *